(12) United States Patent
Kwak

(10) Patent No.: US 6,226,211 B1
(45) Date of Patent: May 1, 2001

(54) MERGED MEMORY-LOGIC SEMICONDUCTOR DEVICE HAVING A BUILT-IN SELF TEST CIRCUIT

(75) Inventor: Jong-taek Kwak, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/539,429

(22) Filed: Mar. 30, 2000

(30) Foreign Application Priority Data

Sep. 8, 1999 (KR) .................................................. 99-38167

(51) Int. Cl.[7] ....................................................... G11C 7/00
(52) U.S. Cl. ............................................................. 365/201
(58) Field of Search ............................................. 365/201

(56) References Cited

U.S. PATENT DOCUMENTS 5,848,016 * 12/1998 Kwak .................................... 365/201
5,926,420 * 7/1999 Kim ...................................... 365/201
6,108,252 * 8/2000 Park ..................................... 365/201
6,158,036 * 12/2000 Kwak ................................... 365/201

* cited by examiner

Primary Examiner—Trong Phan
(74) Attorney, Agent, or Firm—Skjerven Morrill MacPherson LLP; David W. Heid

(57) ABSTRACT

A merged memory-logic semiconductor device having a built-in self test (BIST) circuit is provided. The merged memory-logic semiconductor device includes a memory having a first data bus via which data is input or output in parallel, a control unit connected to the first data bus, a logic circuit connected to the control unit via a second data bus for writing data in the memory and reading the written data, and a built-in self test (BIST) circuit connected to the control unit via a third data bus of the same size as the first data bus, for testing the function of the memory. The control unit connects the logic circuit to the memory in a read/write mode and connects the built-in self test circuit to the memory in a test mode.

13 Claims, 3 Drawing Sheets

MERGED MEMORY-LOGIC SEMICONDUCTOR DEVICE HAVING A BUILT-IN SELF TEST CIRCUIT

BACKGROUND OF THE INVENTION

1. Field of the Invention

The present invention relates to a semiconductor device, and more particularly, to a merged memory-logic semiconductor device in which a memory and a logic circuit are implemented on a single semiconductor device.

2. Description of the Related Art

Referring to FIGS. 1A and 1B, a conventional merged memory-logic semiconductor device 101 includes a memory 111, a logic circuit 121 and a built-in self test (BIST) circuit 131. The memory 111 includes a plurality of memory cells (not shown). The BIST circuit 131 is used to test whether the plurality of memory cells operate normally. The logic circuit 121 stores data in the memory 111 or reads data stored in the memory 111 to perform a certain function. The memory 111 is electrically connected to the logic circuit 121 and the BIST circuit 131 via respective data buses 141 and 143. The memories 111 shown in FIGS. IA and IB have the same memory capacity, for example, 4 megabits.

Referring to FIG. 1A, each of the data buses 141 and 143 are four bits wide. In other words, 4 bits of data are input in parallel into the memory 111 from the logic circuit 121 or the BIST circuit 131, and, also, four bits of data are output in parallel from the memory 111 to the logic circuit 121 or the BIST circuit 131. Referring to FIG. 1B, data buses 151 and 153 are each eight bits wide. In other words, eight bits of data are input in parallel into the memory 111 from the logic circuit 121 or the BIST circuit 131, and, also, eight bits of data are output in parallel from the memory 111 to the logic circuit 121 or the BIST circuit 131. The sizes of the data buses 151 and 153 are determined based on user requirements.

As described above, in the conventional merged memory-logic semiconductor devices 101, the sizes of the data buses 141, 143, 151 and 153 connecting the respective memories 111 to the respective logic circuits 121 and to the respective BIST circuits 131, are determined based on user requirements, although the memories 111 have the same capacity. For this reason, not only is it expensive to develop the merged memory-logic semiconductor device 101, but it also takes longer for the BIST circuit 131 to test the memory 111 as the width of the data buses 141, 143, 151 and 153 becomes smaller.

SUMMARY OF THE INVENTION

According to the present invention, a merged memory-logic semiconductor device is provided in which, for a given memory capacity, the same design of a single built-in self test (BIST) circuit is used regardless of the size of a data bus connecting the memory to a logic circuit.

According to one aspect of the present invention a merged memory-logic semiconductor device is provided which comprises: a memory having a first data bus of a first bus width for parallel data input and output to the memory; a control unit connected to the first data bus; a logic circuit connected to the control unit by a second data bus having a width less than the width of the first data bus, the logic unit being operative to write data to the memory and read data from the memory; and a built-in self test circuit for testing the memory, the built-in self test unit being connected to the control unit by a third data bus, the control unit being operative to connect the logic circuit to the memory in a read/write mode and being operative to connect the built-in self test circuit to the memory in a test mode. According to another aspect of the present invention, in the merged memory-logic semiconductor device of the foregoing aspect, the width of the third data bus is equal to the width of the first data bus. In yet another aspect, in the merged memory-logic semiconductor device of the first aspect the control unit comprises: a control signal generator for generating a read/write control signal and a test control signal in response to receipt of a signal; and a read/write control driver connected to the control signal generator to receive a read/write control signal and a test control signal, said read/write control driver being operative responsive to receipt of a read/write control signal to connect the logic circuit to the memory, and being operative in response to receipt of a test control signal to connect the built-in self test circuit to the memory.

In accordance with a further aspect of the present invention, a method of manufacturing a merged memory-logic semiconductor device is provided in which the method comprises: providing a memory having a first data bus of a first bus width for parallel data input and output to the memory; providing a control unit and connecting the control unit to the first data bus; providing a logic circuit and connecting the logic circuit to the control unit by a second data bus having a width less than the width of the first data bus; and providing a built-in self test circuit for testing the memory, and connecting the built-in self test circuit to the control unit by a third data bus.

According to the present invention, the testing time for a memory provided in a merged memory-logic semiconductor device is shortened.

BRIEF DESCRIPTION OF THE DRAWINGS

The operation and advantages of the present invention will become more apparent by in light of the detailed description of the invention and reference to the drawings in which.

DESCRIPTION OF THE PREFERRED EMBODIMENTS

Figure 1A:
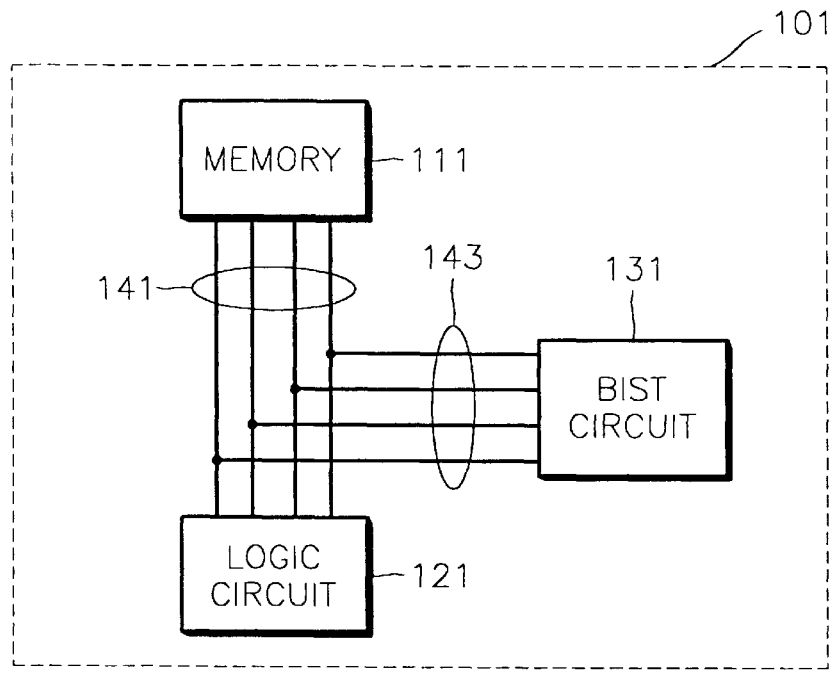
FIGS 1A and 1B are block diagrams of conventional merged memory-logic semiconductor devices.

The present invention will now be described in greater detail with reference to the accompanying drawings, in which preferred embodiments of the invention are shown. The same reference numerals in different drawings represent the same element.

Figure 2:
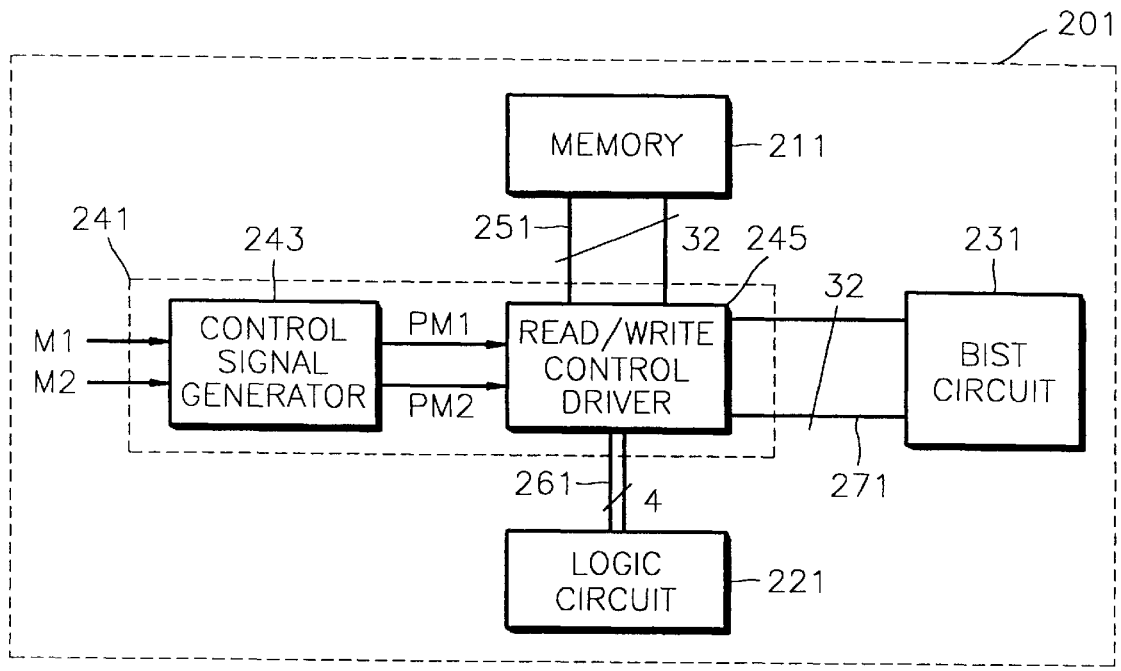
FIG. 2 is a block diagram of a merged memory-logic semiconductor device according to a first embodiment of the present invention.

Referring to FIG. 2, a merged memory-logic semiconductor device 201 according to a first embodiment of the present invention includes a memory 211, a logic circuit 221, a built-in self test (BIST) circuit 231 and a control unit 241. The memory 211 includes a plurality of memory cells (not shown). The BIST circuit 231 is used for testing the memory cells to check whether they operate normally. The logic circuit 221 stores or reads data in or from the memory 221 to perform a certain function. First through third data buses 251, 261 and 271 electrically connect the control unit 241 to the memory 211, the control unit 241 to the logic circuit 221 and the control unit 241 to the BIST circuit 231, respectively.

The second data bus 261 connecting the control unit 241 to the logic circuit 221 includes four data lines. In other words, four bits of data are transmitted in parallel via the second data bus 261. The first and third data buses 251 and 271, which connect the control unit 241 to the memory 211 and the control unit 241 to the BIST circuit 231, respectively, each includes 32 data lines. In other words, 32 bits of data are transmitted in parallel via the first and third data buses 251 and 271, respectively.

The control unit 241 includes a read/write control driver 245 and a control signal generator 243. The read/write control driver 245 sends or receives data to or from the memory 211, the logic circuit 221 and the BIST circuit 231 through the first through third data buses 251, 261 and 271, respectively. The control signal generator 243 generates control signals PM1 and PM2 in response to externally supplied input signals M1 and M2. The external signals M1 and M2 inform the control signal generator 243 whether the merged memory-logic semiconductor device 201 is to operate in a normal mode in which the logic circuit reads data from or writes data to memory 211, or a test mode. For example, when the external signal M1 is activated to a logic high state, this means that the merged memory-logic semiconductor device 201 is to operate in the normal mode. On the other hand, when the external signal M2 is activated to a logic high state, this means that the merged memory-logic semiconductor device 201 is to operate in the test mode. As noted above, when the merged memory-logic semiconductor device 201 operates in the normal mode, that is, writes or reads data, data from the logic circuit 221 is written to the memory 211 or data is read from the memory 211 and transmitted to the logic circuit 221. When the merged memory-logic semiconductor device 201 operates in the test mode, data is written to the memory 211 by the BIST circuit 231 and then the written data is read by the BIST circuit 231 to determine whether the memory 211 is operating normally or not from the read result.

During the write operation, the external signal M1 is activated. The control signal generator 243 then activates the control signal PM1. In response to the control signal PM1, the read/write control driver 245 connects the second data bus 261 to the first data bus 251. Accordingly, the read/write control driver 245 converts data input from the logic circuit 221 via the second data bus 261 and transmits the converted data to the memory 211 via the first data bus 251. Specifically, the read/write control driver 245 converts 4-bit data input from the logic circuit 221 into 32-bit data and transmits the 32-bit data to the memory 211 via the first data bus 251.

During the read operation, the external signal M1 is activated. The control signal generator 243 then activates the control signal PM1. In response to the control signal PM1, the read/write control driver 245 connects the first data bus 251 to the second data bus 261. Accordingly, the read/write control driver 245 converts data input from the memory 211 via the first data bus 251 and transmits the converted data to the logic circuit 221 via the second data bus 261. Specifically, the read/write control driver 245 converts 32-bit data input from the memory 211 into serial data and transmits 4 bits of serial data at a time to the logic circuit 221 via the second data bus 261.

The read/write control driver 245 is connected to the memory 211 and to the BIST circuit 231 via the first and third data buses 251 and 271, respectively. During the test mode, the external signal M2 is activated. Then, the control signal generator 243 activates the control signal PM2. In response to the control signal PM2, the read/write control driver 245 connects the first and third data buses 251 and 271. The data lines of the first and third data buses 251 and 271 are connected to each other on a one-to-one basis. Accordingly, 32-bit data output in parallel from the BIST circuit 231 is written to the memory 211 via the third and first data buses 271 and 251. Thereafter, 32-bit data is output in parallel from the memory 211 and transmitted to the BIST circuit 231 via the first and third data buses 251 and 271. The BIST circuit 231 compares and analyzes the data to determine whether the memory 211 is operating normally or not.

As described above, both first and third data buses 251 and 271 for connecting the BIST circuit 231 to the memory 211 each include 32 data lines, thereby reducing the testing time of the memory 211 by the BIST circuit 231. The BIST circuit 231 tests memory 211 of FIG. 2 eight times faster than the BIST circuit 131 tests memory 111 of FIG. 1A.

Figure 1B:
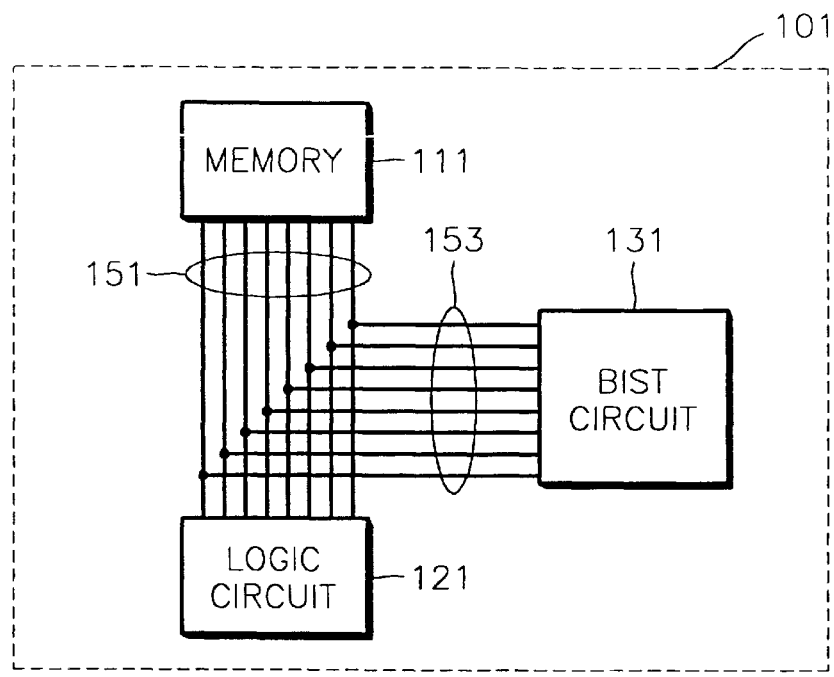
Figure 3:
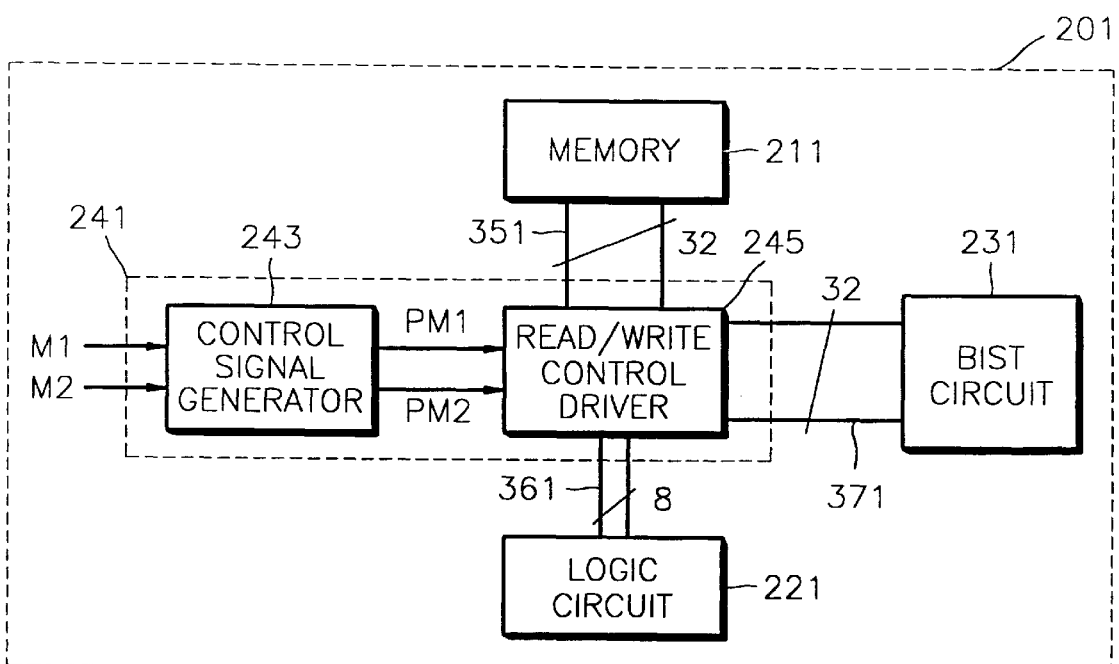
FIG. 3 is a block diagram of a merged memory-logic semiconductor device according to a second embodiment of the present invention.

Referring to FIG. 3, in a merged memory-logic semiconductor device 201, eight data lines are used to form a data bus 361 for connecting the control unit 241 to the logic circuit 221, while thirty-two data lines are used to form each of data buses 351 and 371 for connecting the control unit 241 to the memory 211 and the control unit 241 to the BIST circuit 231, respectively. Since each of the data buses 351 and 371 between the memory 211 and the BIST circuit 231 comprises thirty-two data lines, the testing time of the memory 211 by the BIST circuit 231 in FIG. 3 is reduced to one-fourth of the testing time required for the memory in FIG. 1B.

Figure 4:
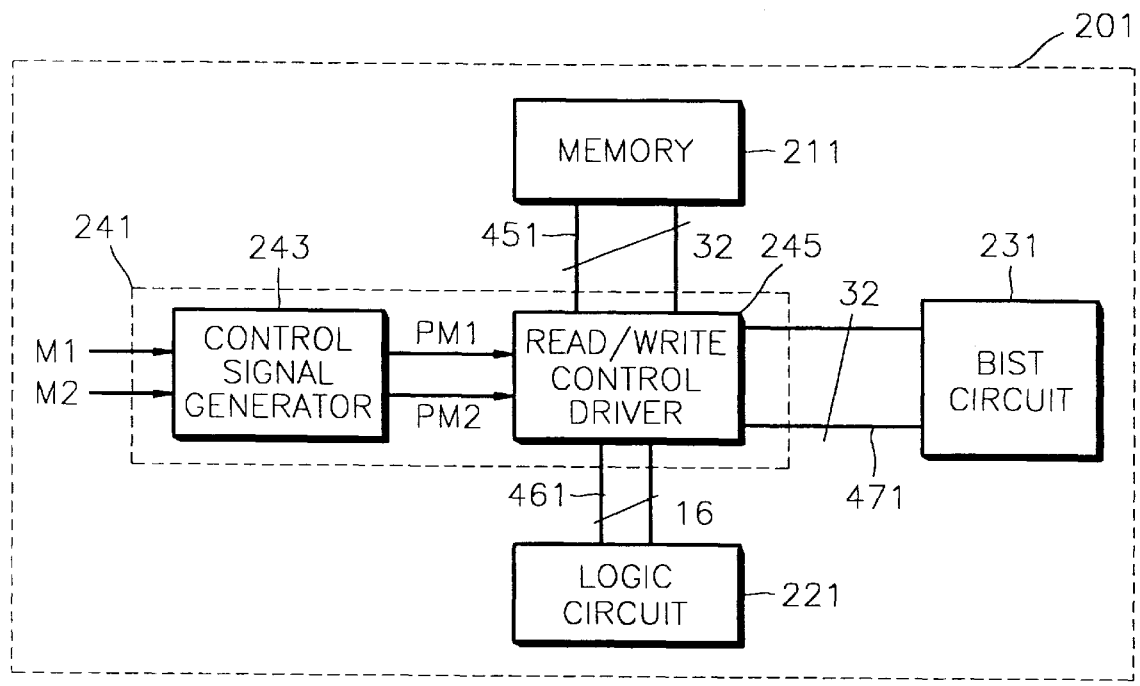
FIG. 4 is a block diagram of a merged memory-logic semiconductor device according to a third embodiment of the present invention.

Referring to FIG. 4, in a merged memory-logic semiconductor device 201, sixteen data lines are used to form a data bus 461 for connecting the control unit 241 to the logic circuit 221, while thirty-two data lines are used to form each of data buses 451 and 471 for connecting the control unit 241 to the memory 211 and the control unit 241 to the BIST circuit 231, respectively.

Figure 5:
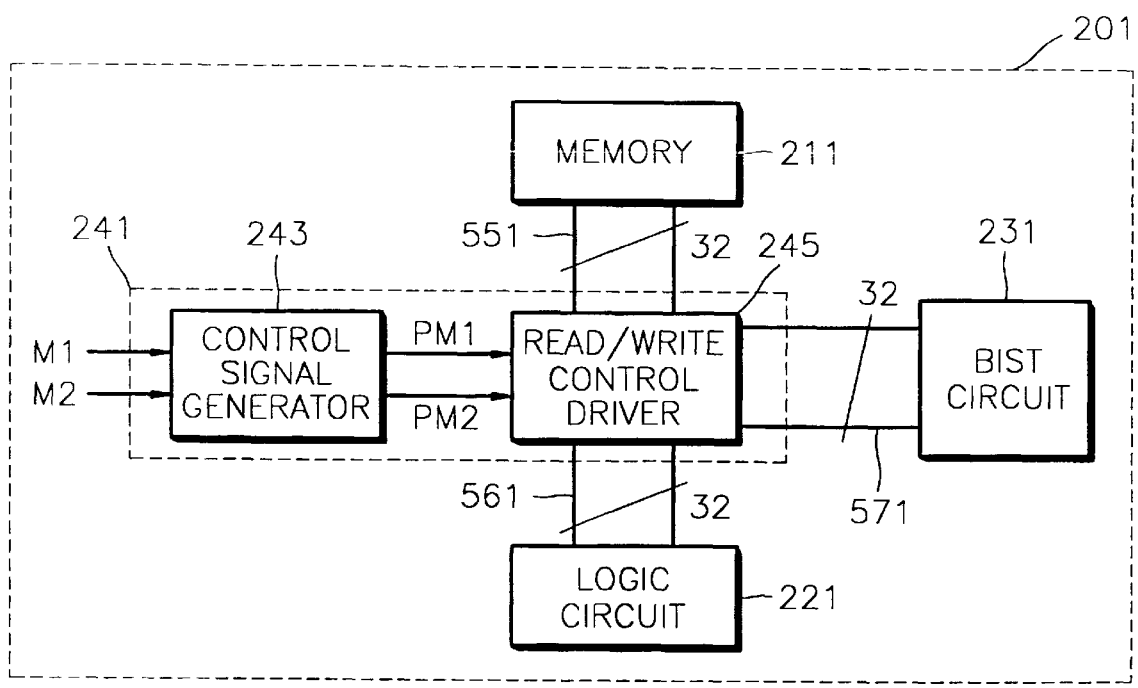
FIG. 5 is a block diagram of a merged memory-logic semiconductor device according to a fourth embodiment of the present invention.

Referring to FIG. 5, in a merged memory-logic semiconductor device 201, thirty-two data lines are used to form a data bus 561 for connecting the control unit 241 to the logic circuit 221. Thirty-two data lines are also used to form each of data buses 551 and 571 for connecting the control unit 241 to the memory 211 and the control unit 241 to the BIST circuit 231, respectively.

As described above, in the merged memory-logic semiconductor device 201 shown in FIGS. 2 through 5, although the sizes of the data buses 261, 361, 461 and 561, each for connecting the control unit 241 to the logic circuit 221, are different, each of the data buses 251, 351, 451 and 551 for connecting the control unit 241 to the memory 221, and each of the data buses 271, 371, 471 and 571 for connecting the control unit 241 to the BIST circuit 231, are composed of thirty-two data lines. The memories 211 shown in FIGS. 2 through 5 have the same capacity, for example, 4 megabits. Therefore, the cost of developing the memory 211 and the BIST circuit 231 is reduced and the testing time of the memory 211 by the BIST circuit 231 is shortened.

In the embodiments shown in FIGS. 2 through 5 the sizes of the data buses respectively connecting the control unit 241 to the memory 211 and the control unit 241 to the BIST circuit 231 are illustrated as thirty-two bits in width. However, the sizes of the data buses may be greater in practice. As the capacity of a memory increases, the size of a bus increases. As the capacity of a memory decreases, the size of a bus decreases.

According to the present invention, the sizes of buses for connecting a memory to a BIST circuit are designed to be maximum with respect to memories having the same capacity, thereby reducing the development cost of a merged memory-logic semiconductor device and shortening the testing time of the memory by the BIST circuit.

While this invention has been particularly shown and described with reference to preferred embodiments thereof, it will be understood by those skilled in the art that various changes in form and details may be made therein without departing from the spirit and scope of the invention as defined by the appended claims. While this invention has been particularly shown and described with reference to preferred embodiments thereof, it will be understood by those skilled in the art that various changes in form and details may be made therein without departing from the spirit and scope of the invention as defined by the appended claims.

I claim:

1. A merged memory-logic semiconductor device comprising:

a memory having a first data bus of a first bus width for parallel data input and output to the memory;

a control unit connected to the first data bus;

a logic circuit connected to the control unit by a second data bus having a width less than the width of the first data bus, said logic unit being operative to write data to the memory and read data from the memory; and a built-in self test circuit for testing the memory, said built-in self test circuit being connected to the control unit by a third data bus, said control unit being operative to connect the logic circuit to the memory in a read/write mode and being operative to connect the built-in self test circuit to the memory in a test mode.

2. The merged memory-logic semiconductor device of claim 1, wherein a width of the third data bus is equal to the width of the first data bus.

3. The merged memory-logic semiconductor device of claim 1, wherein the control unit comprises:

a control signal generator for generating a read/write control signal and a test control signal in response to receipt of a signal; and a read/write control driver connected to the control signal generator to receive a read/write control signal and a test control signal, said read/write control driver being operative responsive to receipt of a read/write control signal to connect the logic circuit to the memory, and being operative in response to receipt of a test control signal to connect the built-in self test circuit to the memory.

4. The merged memory-logic semiconductor device of claim 1, wherein in the read/write mode the control unit converts serial data received on the second data bus into parallel data for transmission of the parallel data to the memory, and wherein said control unit converts parallel data received via the first data bus into serial data to transmit the serial data to the logic unit.

5. A merged memory-logic semiconductor device comprising:

a memory having a first data bus of a first bus width for parallel data input and output to the memory;

a control unit connected to the first data bus;

a logic circuit connected to the control unit by a second data bus having a width equal to the width of the first data bus, said logic unit being operative to write data to the memory and read data from the memory; and a built-in self test circuit for testing the memory, said built-in self test circuit being connected to the control unit by a third data bus, said control unit being operative to connect the logic circuit to the memory in a read/write mode and being operative to connect the built-in self test circuit to the memory in a test mode.

6. The merged memory-logic semiconductor device of claim 5, wherein the control unit comprises:

a control signal generator for generating a read/write control signal and a test control signal in response to receipt of a signal; and a read/write control driver connected to the control signal generator to receive a read/write control signal and a test control signal, said read/write control driver being operative responsive to receipt of a read/write control signal to connect the logic circuit to the memory, and being operative in response to receipt of a test control signal to connect the built-in self test circuit to the memory.

7. The merged memory-logic semiconductor device of claim 5, wherein a width of the third data bus is equal to the width of the first data bus.

8. A method of manufacturing a merged memory-logic semiconductor device comprising:

providing a memory having a first data bus of a first bus width for parallel data input and output to the memory;

providing a control unit and connecting the control unit to the first data bus;

providing a logic circuit and connecting the logic circuit to the control unit by a second data bus having a width less than the width of the first data bus; and providing a built-in self test circuit for testing the memory, and connecting the built-in self test circuit to the control unit by a third data bus.

9. The method of claim 8, wherein connecting the built-in self test unit to the control unit by the third data bus and connecting the control unit to the first data bus comprises providing the third data bus and the first data bus with an equal bus width.

10. The method of claim 8, wherein the step of providing a control unit comprises:

providing a control signal generator which is operative to generate a read/write control signal and a test control signal in response to receipt of a signal; and providing a read/write control driver and connecting the control signal generator to the read/write control driver, the read/write control driver being operative responsive to receipt of a read/write control signal to connect the logic circuit to the memory, and being operative in response to receipt of a test control signal to connect the built-in self test circuit to the memory.

11. A method of manufacturing a merged memory-logic semiconductor device comprising:

providing a memory having a first data bus of a first bus width for parallel data input and output to the memory;

providing a control unit and connecting the control unit to the first data bus;

providing a logic circuit and connecting the logic circuit to the control unit by a second data bus having a width equal to the width of the first data bus; and providing a built-in self test circuit for testing the memory and connecting the built-in self test circuit to the control unit by a third data bus.

12. The method of claim 11, wherein the step of providing a control unit comprises:

providing a control signal generator which is operative to generate a read/write control signal and a test control signal in response to receipt of a signal; and providing a read/write control driver and connecting the control signal generator to the read/write control driver, the read/write control driver being operative responsive to receipt of a read/write control signal to connect the logic circuit to the memory, and being operative in response to receipt of a test control signal to connect the built-in self test circuit to the memory.

13. The method of claim 11, wherein connecting the built-in self test circuit to the control unit by the third data bus and connecting the control unit to the first data bus comprises providing the third data bus and the first data bus with an equal bus width.

* * * * *